(12) United States Patent
Chen et al.

(10) Patent No.: US 10,483,976 B1
(45) Date of Patent: Nov. 19, 2019

(54) CIRCUITS TO INTERPRET PIN INPUTS

(71) Applicant: TEXAS INSTRUMENTS INCORPORATED, Dallas, TX (US)

(72) Inventors: Jikai Chen, Allen, TX (US); Yanli Fan, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/989,135

(22) Filed: May 24, 2018

(51) Int. Cl.
| H03K 19/0185 | (2006.01) |
| H03K 5/08 | (2006.01) |
| H03K 3/356 | (2006.01) |

(52) U.S. Cl.
CPC ........... H03K 19/018521 (2013.01); H03K 3/356113 (2013.01); H03K 3/356165 (2013.01); H03K 5/08 (2013.01)

(58) Field of Classification Search
CPC ............ H03M 5/18; H03M 5/16; H03M 5/00
See application file for complete search history.

(56) References Cited

U.S. PATENT DOCUMENTS

| 3,969,633 | A | * | 7/1976 | Paluck | H03K 19/09425 326/60 |
| 5,194,766 | A | * | 3/1993 | Sugawara | H03M 5/20 326/115 |
| 5,264,743 | A | * | 11/1993 | Nakagome | G11C 5/147 326/21 |
| 5,479,114 | A | * | 12/1995 | Miura | H03K 17/302 326/21 |
| 5,498,980 | A | * | 3/1996 | Bowles | H03M 5/18 326/59 |
| 5,534,817 | A | * | 7/1996 | Suzuki | G05F 3/247 327/541 |
| 5,610,537 | A | * | 3/1997 | Hastings | H03M 5/16 326/121 |
| 6,219,166 | B1 | * | 4/2001 | Shang | H04B 10/695 398/202 |
| 6,624,669 | B1 | * | 9/2003 | Tsuchi | G09G 3/3688 326/83 |
| 7,088,139 | B1 | * | 8/2006 | Blom | H03K 19/0002 326/106 |
| 7,741,870 | B2 | * | 6/2010 | Hurtz | H03K 19/1732 326/30 |
| 8,749,272 | B1 | * | 6/2014 | Schacht | H03K 5/2472 326/57 |
| 9,154,130 | B2 | * | 10/2015 | Edelson | H03K 19/0002 |

* cited by examiner

Primary Examiner — Thomas J. Hiltunen
(74) Attorney, Agent, or Firm — John R. Pessetto; Charles A. Brill; Frank D. Cimino

(57) ABSTRACT

In examples, an apparatus comprises a pin, an input buffer coupled to the pin at an output of the input buffer, a voltage divider circuit coupled to the input buffer at an input of the input buffer, a first current mirror coupled to the input buffer, and a second current mirror coupled to the input buffer. The apparatus also comprises a first output buffer coupled between the input buffer and the first current mirror, and a second output buffer coupled between the input buffer and the second current mirror.

12 Claims, 3 Drawing Sheets

CIRCUITS TO INTERPRET PIN INPUTS

CROSS-REFERENCE TO RELATED APPLICATIONS

The present application relates to U.S. Provisional Patent Application No. 62/216,436, which was filed Sep. 10, 2015, is titled "Low Power Multi-Level Control Scheme For Ultra Low Power USB3.0 System With High Leakage Tolerance," and is hereby incorporated herein by reference in its entirety.

SUMMARY

In examples, an apparatus comprises a pin, an input buffer coupled to the pin at an output of the input buffer, a voltage divider circuit coupled to the input buffer at an input of the input buffer, a first current mirror coupled to the input buffer, and a second current mirror coupled to the input buffer. The apparatus also comprises a first output buffer coupled between the input buffer and the first current mirror, and a second output buffer coupled between the input buffer and the second current mirror.

In examples, an apparatus comprises a pin, an input buffer coupled to the pin, and a first current mirror coupled to the input buffer, the first current mirror comprising three transistors, each of the three transistors in the first current mirror coupling to a different one of three legs of the apparatus. The apparatus also includes a second current mirror coupled to the input buffer, the second current mirror comprising three transistors, each of the three transistors in the second current mirror coupling to a different one of the three legs of the apparatus. The apparatus further comprises multiple level shifters positioned in a common leg of the three legs, a voltage divider circuit coupled to the multiple level shifters, a first output buffer coupled to the input buffer and the first current mirror, and a second output buffer coupled to the input buffer and the second current mirror.

In examples, an apparatus comprises a pin, a first n-type metal oxide semiconductor field effect transistor (MOSFET) coupled to the pin, a first p-type MOSFET coupled to the pin, a second p-type MOSFET coupled to the first n-type MOSFET, a second n-type MOSFET coupled to the first p-type MOSFET, a third p-type MOSFET coupled to the second p-type MOSFET, a third n-type MOSFET coupled to the third p-type MOSFET and to the first n-type MOSFET, and a fourth p-type MOSFET coupled to the third n-type MOSFET and to the first p-type MOSFET. The apparatus also comprises a fourth n-type MOSFET coupled to the fourth p-type MOSFET and to the second n-type MOSFET, a fifth p-type MOSFET coupled to the second and third p-type MOSFETs, a fifth n-type MOSFET coupled to the second and fourth n-type MOSFETs, and a voltage divider circuit comprising two resistors, a node between the resistors comprising a node between the third n-type MOSFET and the fourth p-type MOSFET. The apparatus further comprises a first output buffer coupled to the first n-type MOSFET and the second p-type MOSFET, a second output buffer coupled to the first p-type MOSFET and the second n-type MOSFET, and a voltage source coupled to the second, third, and fifth p-type MOSFETs. The second, fourth, and fifth n-type MOSFETs couple to ground.

In examples, an apparatus, comprises a voltage source, a current mirror coupled to the voltage source, a voltage divider circuit coupled to the voltage source, multiple level shifters coupled to the voltage divider circuit, and two or more legs coupled to the current mirror and the multiple level shifters. Each of the two or more legs comprises a pin, a first n-type field effect transistor (FET) coupled to the pin, a first p-type FET coupled to the pin, a first output buffer coupled to the first n-type FET, a second output buffer coupled to the first p-type FET, a second p-type FET coupled to the first output buffer, and a second n-type FET coupled to the second output buffer.

BRIEF DESCRIPTION OF THE DRAWINGS

For a detailed description of various examples, reference will now be made to the accompanying drawings in which.

DETAILED DESCRIPTION

Figure 1:
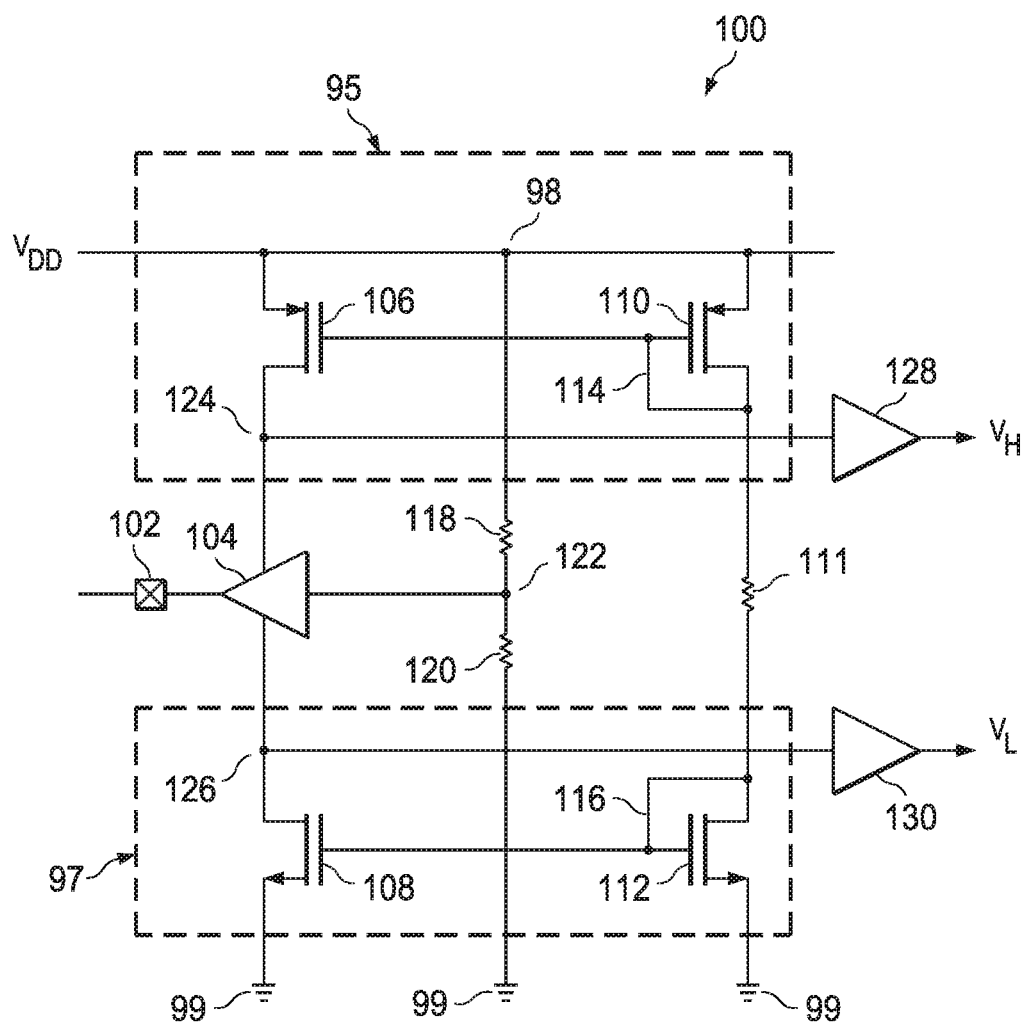
FIG. 1 is a schematic diagram of an illustrative input voltage detection circuit in accordance with various examples.

Circuits are often packaged using various materials, such as epoxy, to protect the circuits from being damaged by environmental factors. Although packaging materials protect the circuits housed inside the packages, the materials are electrically insulative. Accordingly, pins are used to facilitate electrical communications between the circuits inside packages and other circuitry external to the packages. Such pins enable the packaged circuits to receive power and to input and output various types of data. Some such pins receive input signals from microcontrollers that pull the input signal voltages up to power supply voltages, down to ground, or the input signals are left floating. Such pins are referred to as "tri-level pins," because these pins and their associated circuitry inside the package receive and interpret high voltages, low voltages, and floating voltages.

Traditional tri-level pins and their associated circuitry are subject to various disadvantages. For example, a microcontroller that drives a tri-level pin may provide a leakage current on the pin when the pin is floating, thus causing the circuitry to which the pin is coupled to misinterpret the signal being provided on the pin. In another example, such pins often connect directly to transistor gate terminals in the packaged circuitry, thus exposing the gate terminals to potential damage in the event of electrostatic discharges (ESDs). Such problems, in turn, frequently lead to other problems. For example, the presence of leakage current can require the use of high quiescent currents within the package to overcome the influence of the leakage current, but such high quiescent currents cause unnecessary power consumption.

This disclosure describes examples of input voltage detection circuits that overcome the foregoing problems. In some examples, a circuit comprises a pin, a buffer coupled to the pin, and a voltage divider circuit coupled to the buffer. The circuit further comprises a first current mirror circuit coupled to the buffer, a second current mirror circuit coupled to the buffer, a first output buffer coupled between the buffer and the first current mirror circuit, and a second output buffer coupled between the buffer and the second current mirror circuit. When an input signal applied to the pin has a high voltage, the first and second output buffers provide digital signals that indicate that the pin is receiving a high voltage (e.g., a voltage above a threshold). Similarly, when the input signal applied to the pin has a low voltage (e.g., is pulled down to ground), the first and second output buffers produce digital signals that indicate that the pin is receiving a low voltage (e.g., a voltage below a threshold). Likewise, when the input signal applied to the pin is floating (neither high nor low), the first and second output buffers produce digital signals that indicate that the pin is in a floating state (e.g., a voltage between the aforementioned thresholds). Illustrative configurations of such circuitry and their operation are now described with respect to FIGS. 1-3. Each of these configurations overcomes the problems described above at least in part because each such configuration (1) drives the voltage at the pin to a predetermined level when the pin is floating (thus mitigating the problems associated with floating pin voltages, including quiescent currents), and (2) avoids direct coupling between the pin and transistor gate terminals within the circuit (thus mitigating ESD concerns). Such circuits find application in a variety of contexts, such as in Universal Serial Bus (USB) applications.

FIG. 1 is a schematic diagram of an illustrative input voltage detection circuit 100 in accordance with various examples. In some examples, some or all of the circuit 100 is housed within a package, such as an epoxy package. The circuit 100 includes a pin 102, which, in some examples, is not housed within a package, or is only partially housed within a package. The circuit 100 additionally comprises an input buffer 104 coupled to the pin 102; a transistor 106 (e.g., a p-type metal oxide semiconductor field effect transistor (MOSFET)) coupled to a power input of the buffer 104 via a node 124; a voltage source VDD 98 coupled to the transistor 106; a transistor 108 (e.g., an n-type MOSFET) coupled to another power input of the buffer 104 via a node 126; a transistor 110 (e.g., a p-type MOSFET) coupled to VDD 98 and to the transistor 106; a transistor 112 (e.g., an n-type MOSFET) coupled to the transistor 110 via a resistor 111 and to the transistor 108; an output buffer 128 coupled to the node 124 and providing a binary output signal $V_H$; an output buffer 130 coupled to the node 126 and providing a binary output signal $V_L$; ground 99 coupled to the transistors 108 and 112; a resistor 118 coupled to VDD 98 and to node 122; and a resistor 120 coupled to the node 122 and to ground 99. In examples, the pin 102 couples to an output of the buffer 104 and the node 122 couples to an input of the buffer 104. (The terms "output" and "input," when used in reference to the buffer 104, refer to the traditional designations of inputs and outputs of buffer circuits. However, as one of ordinary skill recognizes, signals can be applied to any suitable node of circuitry to achieve a desired result. This is the case here, where the pin 102 and node 122 both receive input signals that are applied to the output and input of the buffer 104, respectively. A more detailed description is provided below with respect to FIG. 2.)

The resistors 118 and 120 form a voltage divider network, meaning that the resistors 118 and 120 produce a voltage at the node 122 that is a fraction of the potential between VDD 98 and ground 99. The specific resistances of the resistors 118 and 120 (and, thus, the voltage produced at the node 122) varies depending on the application. In examples, the gates of the transistors 106 and 110 are tied together, and the gates of the transistors 108 and 112 are tied together. In examples, the gate and the drain of the transistor 110 are tied together via a connection 114, and in examples, the gate and the drain of the transistor 112 are tied together via a connection 116. Due to the specific terminal connections described above, the transistors 106 and 110 form a current mirror circuit 95. Similarly, due to the specific terminal connections described above, the transistors 108 and 112 form another current mirror circuit 97.

Figure 2:
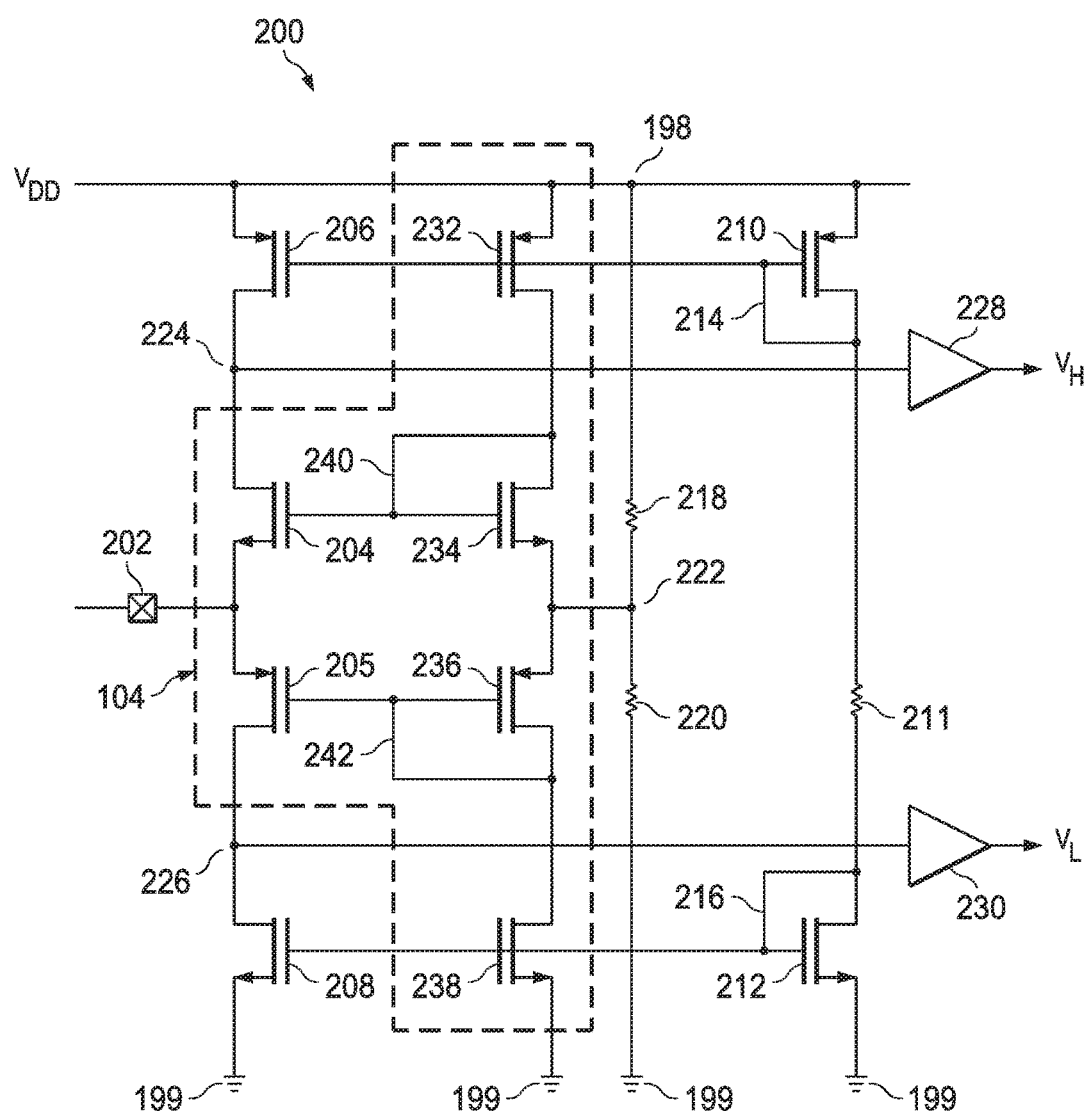
FIG. 2 is a schematic diagram of another illustrative input voltage detection circuit in accordance with various examples.
Figure 3:
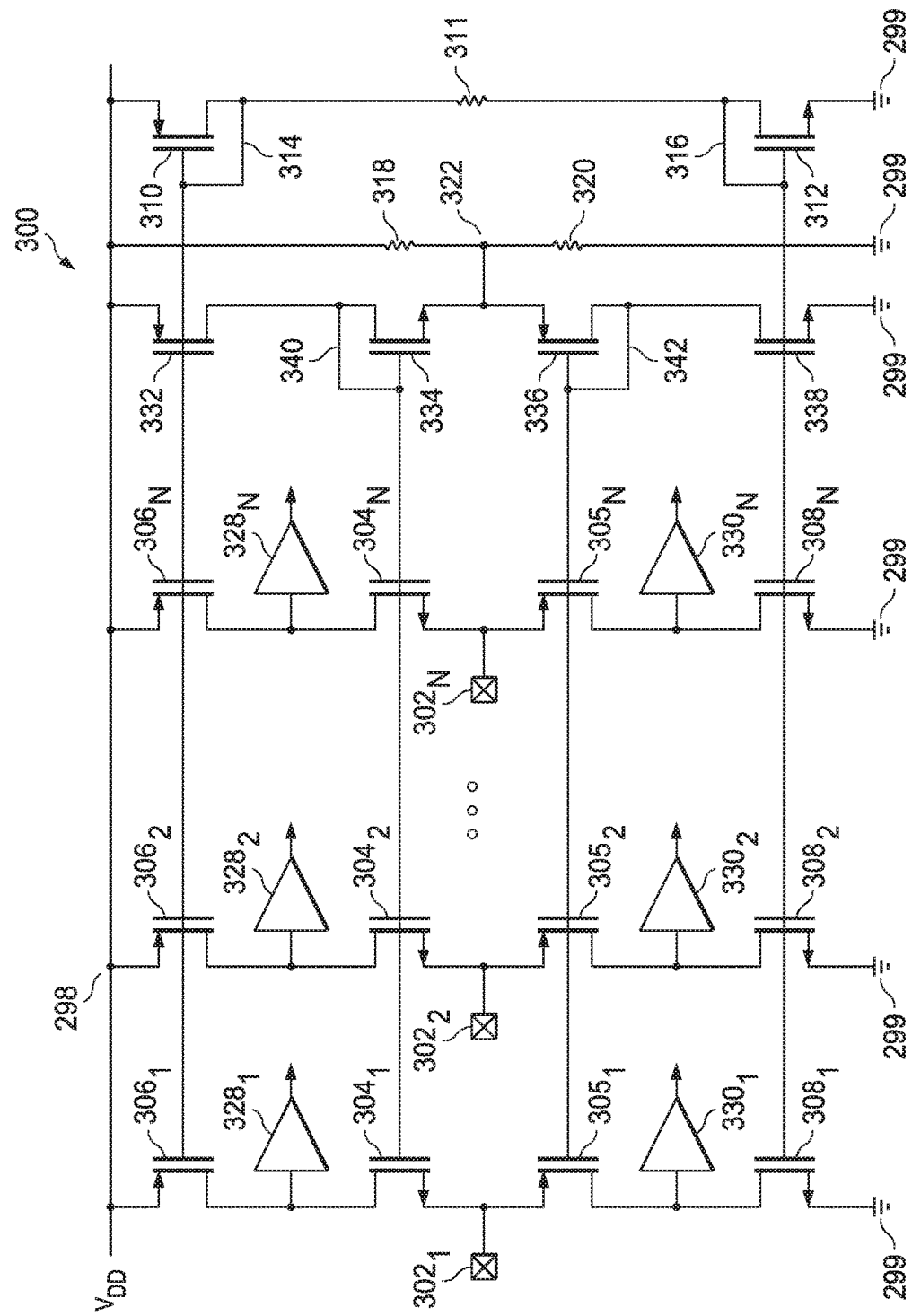
FIG. 3 is a schematic diagram of another illustrative input voltage detection circuit in accordance with various examples.

The circuit 100 is described herein as having three "legs"—a first leg comprising the transistors 106, 108 and the buffer 104; a second leg comprising the resistors 118, 120; and a third leg comprising the transistors 110, 112. The circuits depicted in FIGS. 2 and 3 are similarly described herein as having such "legs."

The circuit 100 is illustrative, and the scope of disclosure is not limited to the specific circuit components shown in FIG. 1, nor is the scope of disclosure limited to the specific configuration of circuit components shown in FIG. 1. For example, although the transistors in circuit 100 are depicted as being MOSFETs, in some examples, other types of transistors are substituted for some or all of the MOSFETs. In some examples, different transistor sizes are used. In some examples, resistors with different resistances are used. In some examples, one or more of the various components are connected within the circuit 100 differently than shown in FIG. 1. Many such variations of the circuit 100 are possible that operate according to the same or similar general principle as circuit 100. All such variations are contemplated and included within the scope of this disclosure.

In operation, the input applied at pin 102 is to be received and categorized as being either a high input, a low input, or a floating input. When a high input (e.g., VDD) is applied to the pin 102, the internal transistor (e.g., an n-type MOSFET) within the buffer 104 that switchably couples the pin 102 to the node 124 is turned off. (As mentioned, illustrative contents of the buffer 104 are described below with reference to FIGS. 2 and 3.) The transistor 106, however, is on because the source terminal of the transistor 106 receives a sufficiently high voltage with respect to the gate terminal of the transistor 106 so as to form a channel between the source and drain terminals of the transistor 106. This causes the node 124 to be pulled high, and the output buffer 128 outputs a high $V_H$ signal. In addition, when the high input is applied to the pin 102, the internal transistor (e.g., a p-type MOSFET) within the buffer 104 that switchably couples the pin 102 to the node 126 is strongly turned on, while the transistor 108 is only weakly turned on. Because the transistor 108 is only weakly turned on, the transistor 108 does not sink a substantial amount of the current from the pin 102 to ground 99, thereby pulling up the node 126. As a result, the output $V_L$ of buffer 130 is high. Thus, a high $V_H$ in tandem with a high $V_L$ should be interpreted to mean that a high signal (e.g., VDD) is applied to the pin 102. The precise voltages at pin 102 that qualify as "high" depend on the design of the circuit, such as, for example, the threshold voltages of the transistors 106 and 108 and the transistors within the buffer 104.

Still referring to FIG. 1, when a low signal (e.g., ground) is applied to pin 102, the transistor within the buffer 104 that switchably couples the pin 102 to the node 124 turns on. Although the transistor 106 is also on, its physical parameters are such that it is more weakly turned on relative to the transistor in the buffer 104 positioned between the pin 102 and the transistor 106, and so the ground connection at pin 102 overpowers the upward pull provided by the transistor 106 and pulls the node 124 low. Thus, the buffer 128 outputs a low $V_H$ signal. At the same time, the transistor within the buffer 104 that switchably couples the pin 102 to the node 126 is off, and the transistor 108 is strongly turned on, thus pulling the node 126 low. As a result, the buffer 130 outputs a low $V_L$ signal. Thus, a low $V_H$ signal and a low $V_L$ signal are interpreted as signifying a low input signal at pin 102. As explained, the precise voltages at pin 102 that qualify as "low" depend on the design of the circuit, such as, for example, the threshold voltages of the transistors 106 and 108 and the transistors within the buffer 104.

Still referring to the operation of the input voltage detection circuit 100 of FIG. 1, when the pin 102 is floating, the voltage divider circuit formed by resistors 118, 120 develops a voltage at node 122, and this voltage is forced onto the pin 102 via the buffer 104. This voltage is stable because it is formed with VDD 98, ground 99, and resistors 118, 120, all of which are stable components that do not exhibit dynamic behavior. The resistances of the resistors 118, 120, as well as the VDD 98, are selectable to provide a specific voltage at the pin 102 when the pin 102 is floating. In examples, a voltage value in the middle of the range of voltages applied to the pin 102 is selected so that transistors in the circuit 100 are not inadvertently turned on or off (and, thus, undesirable or unpredictable behavior is mitigated).

At the same time, the transistors 110, 112 form a current source, since the source terminal of the transistor 110 is coupled to VDD 98 (thus keeping the transistor 110 on) and the source terminal of the transistor 112 is coupled to ground 99 (thus keeping the transistor 112 on), thereby providing a path from VDD 98 to ground 99 via the transistors 110, 112. Because the source terminals of the transistors 106, 110 are tied together and the gate terminals of the transistors 106, 110 are tied together, the transistors 106, 110 behave identically or substantially identically. Similarly, the source terminals of the transistors 108, 112 are tied together, and the gate terminals of the transistors 108, 112 are tied together (in examples, the gate terminals of the transistors 106, 108, 110, and 112 are tied together), thereby causing the transistors 108, 112 to behave identically or substantially identically. Further, in examples, the width-by-length sizing ratio between the transistors 106, 110 is greater than 1:1—for example, 10:1. Similarly, in examples, the width-by-length sizing ratio of the transistors 108, 112 is greater than 1:1—for instance, 10:1. In examples, the transistors within the buffer 104 are sized similarly to the transistors 110, 112. The current flowing through the transistors 110, 112—for example, 1 microAmpere—is mirrored to the transistors 106, 108, but because the transistors 106, 108 are sized to be larger than the transistors 110, 112, they can carry significantly more current—e.g., 10 microAmperes. However, such current would flow through the transistors within the buffer 104, and in examples, these transistors within the buffer 104 are sized similarly to the transistors 110, 112. Thus, the current that flows through the leg of circuit 100 formed by transistors 106, 108 and the transistors within the buffer 104 is limited by the channel dimensions of the smaller transistors in the buffer 104. As a result, the current flowing through this leg of the circuit 100 is, for example, 1 microAmpere. Consequently, because of the large channel sizes of the transistors 106 and 108, the nodes 124, 126 are pulled high and low, respectively, with minimal pull in the opposing direction, since the channels of the transistors in the buffer 104 are relatively smaller in size. Because node 124 is pulled high, the buffer 128 outputs a high $V_H$, and because node 126 is pulled low, the buffer 130 outputs a low $V_L$. A high $V_H$ and a low $V_L$ are interpreted to signify a floating state at the pin 102.

FIG. 2 is a schematic diagram of an illustrative input voltage detection circuit 200 in accordance with various examples. In some examples, the circuit 200 comprises a voltage source VDD 198 and ground 199. The circuit 200 includes four legs. A first leg includes a transistor 206 (e.g., a p-type MOSFET) coupled to VDD 198; a node 224 coupled to the transistor 206; a transistor 204 (e.g., an n-type MOSFET) coupled to the node 224; a transistor 205 (e.g., a p-type MOSFET) coupled to the transistor 204; a node 226 coupled to the transistor 205; and a transistor 208 (e.g., an n-type MOSFET) coupled to the node 226. Ground 199 couples to the transistor 208. A pin 202 couples to the transistors 204 and 205. In examples, transistors 204, 205 correspond to the buffer 104 of FIG. 1.

A second leg includes a transistor 232 (e.g., a p-type MOSFET); a transistor 234 (e.g., an n-type MOSFET); a node 222 coupled to the transistor 234; a transistor 236 (e.g., a p-type MOSFET) coupled to the node 222; and a transistor 238 (e.g., an n-type MOSFET) coupled to the transistor 236. Ground 199 couples to the transistor 238. A connection 240 couples the gate terminal of the transistor 234 to the drain terminal of the transistor 234. Similarly, a connection 242 couples together the gate and drain terminals of the transistor 236. The gate terminals of the transistors 206 and 232 are tied together. The gate terminals of the transistors 204 and 234 are tied together. The gate terminals of the transistors 205 and 236 are tied together. The gate terminals of the transistors 208 and 238 are tied together.

A third leg of the circuit 200 includes resistors 218, 220, and a node 222 positioned between the resistors 218, 220. The resistors 218, 220 form a voltage divider. The node 222 couples to the transistors 234, 236 in the second leg of the circuit 200. The resistor 218 couples to VDD 198 and the resistor 220 couples to ground 199.

A fourth leg of the circuit 200 comprises a transistor 210 (e.g., a p-type MOSFET) coupled to a transistor 212 (e.g., an n-type MOSFET) via a resistor 211. The transistor 210 couples to VDD 198 and the transistor 212 couples to ground 199. A connection 214 ties together the gate and drain terminals of the transistor 210, and a connection 216 ties together the gate and drain terminals of the transistor 212. In examples, the gate terminals of the transistors 206, 232, 210 couple together. In examples, the gate terminals of transistors 208, 238, 212 couple together. The transistors 206, 232, 210 are arranged in a current mirror configuration, and the transistors 208, 238, 212 are arranged in a current mirror configuration. A buffer 228 couples to the node 224 and provides an output $V_H$. A buffer 230 couples to the node 226 and provides an output $V_L$. In examples, the transistors 206 and 208 have a 10× width-by-length size relative to the remaining transistors in the circuit 200, which, in comparison to the transistors 206 and 208, have a 1× size.

The circuit 200 is illustrative, and the scope of disclosure is not limited to the specific circuit components shown in FIG. 2, nor is the scope of disclosure limited to the specific configuration of circuit components shown in FIG. 2. For example, although the transistors in circuit 200 are depicted as being MOSFETs, in some examples, other types of transistors are substituted for some or all of the MOSFETs. In some examples, different transistor sizes are used. In some examples, resistors with different resistances are used. In some examples, one or more of the various components are connected within the circuit 200 differently than shown in FIG. 2. Many such variations of the circuit 200 are possible that operate according to the same or similar general principle as circuit 200. All such variations are contemplated and included within the scope of this disclosure.

In operation, when the voltage at pin 202 is high, the transistor 204 turns off, because the gate-to-source voltage is negative. In addition, in examples, the transistor 206 is consistently on. Thus, the voltage at node 224 is pulled up toward VDD 198, and the buffer 228 outputs a high $V_H$. Also when the voltage at pin 202 is high, the transistor 205 turns on, but the transistor 208 is only weakly on and does not sink a significant amount of current. Accordingly, the voltage at node 226 is pulled high toward the voltage applied at the pin 202, and so the buffer 230 outputs a high $V_L$. Thus, a high $V_H$ and high $V_L$ are interpreted to mean that the voltage at pin 202 is high.

When the voltage at pin 202 is low (e.g., ground), the transistor 204 turns on, because the gate-to-source voltage is higher than the threshold voltage. In addition, in examples, the transistor 206 is consistently on. The pull-down effect of the low voltage at pin 202 overcomes the pull-up effect of the transistor 206, and the buffer 228 outputs a low $V_H$. At the same time, the transistor 205 turns off and the transistor 208 is on, and so the buffer 230 outputs a low $V_L$. Thus, a low $V_H$ and low $V_L$ are interpreted to mean that the voltage at pin 202 is low.

When the voltage at pin 202 is floating, the pin 202 is forced to a predetermined voltage between the high and low voltages described above. More specifically, the VDD 198, ground 199, and resistors 218, 220 are chosen so as to form a predetermined voltage at the node 222. The voltage at node 222 is level-shifted by the threshold voltages of the transistors 234, 204 and 236, 205 such that the voltage forced onto the pin 202 is substantially the same as the voltage developed at node 222. In this manner, the floating voltage at pin 202 is stable and is prevented from inadvertently turning on and off transistors in the circuit 200. At the same time, the leg formed by the transistors 210, 212 forms a current source (e.g., 1 microAmpere), and this current is mirrored to the leg formed by transistors 232, 234, 236, 238 and the leg formed by transistors 206, 204, 205, and 208. As explained above, the transistors 206 and 208 are, in some examples, sized to be substantially larger than the remaining transistors in the circuit 200. Accordingly, the transistors 206 and 208 are capable of carrying greater amounts of current—for example, 10 microAmperes. However, the actual current that flows through the leg containing the transistors 206 and 208 is limited by the current capacities of the transistors 204 and 205, which are sized similarly to the remaining transistors in the circuit 200. Thus, the node 224 is pulled high because of the large current capacity of the transistor 206 and the connection of the transistor 206 to VDD 198, combined with the low current capacity of the transistor 204. Similarly, the node 226 is pulled low because of the large current capacity of the transistor 208 and the connection of the transistor 208 to ground 199, combined with the low current capacity of the transistor 205. As a result, the buffer 228 outputs a high $V_H$ and the buffer 230 outputs a low $V_L$. When $V_H$ is high and $V_L$ is low, the voltage at pin 202 is understood to be floating.

As explained, the transistors 234 and 236 are used for level-shifting purposes to produce a specific voltage at the pin 202 when the pin 202 is floating. The transistors 232 and 238 are present to provide bias currents to the transistors 234 and 236 such that the difference between the currents flowing through the transistors 234 and 236 is substantially smaller than the quiescent current flowing through the leg containing the resistors 218 and 220. As long as the current flowing through the leg containing resistors 218 and 220 is substantially greater than the current flowing from transistors 234, 236 toward the leg containing resistors 218, 220, the voltage at node 222 is well-defined and, thus, the voltage at pin 202 is well-defined when the pin 202 is left floating.

FIG. 3 is a schematic diagram of an illustrative input voltage detection circuit 300 in accordance with various examples. The circuit 300 is useful to mitigate area and power consumption when, for example, multiple input voltages on multiple pins are to be sensed and categorized. In examples, the circuit 300 comprises M legs and N pins, where M is greater than N. Specifically, the legs include a leg that comprises a transistor $306_1$ coupled to a transistor $304_1$, which couples to a transistor $305_1$, which couples to a transistor $308_1$. The transistor $306_1$ couples to a voltage source VDD 298, and the transistor $308_1$ couples to ground 299. In examples, the transistors $306_1$ and $305_1$ are p-type MOSFETs and transistors $304_1$ and $308_1$ are n-type MOSFETs. The leg couples to a buffer $328_1$ and a buffer $330_1$, positioned as shown. A pin $302_1$ couples to a node in between the transistors $304_1$ and $305_1$. The transistors $304_1$ and $305_1$ correspond to the buffer 104 of FIG. 1. In examples, the circuit 300 additionally includes a leg that comprises transistors $306_2$, $304_2$, $305_2$, and $308_2$, coupled as shown. In examples, the transistors $306_2$ and $305_2$ are p-type MOSFETs, and the transistors $304_2$ and $308_2$ are n-type MOSFETs. Buffers $328_2$, $330_2$ and pin $302_2$ couple as shown. Transistors $304_2$ and $305_2$ correspond to the buffer 104 of FIG. 1.

The circuit 300 comprises any number of pins, defined herein as N pins. Accordingly, in examples, a leg of the circuit 300 comprises transistors $306_N$, $304_N$, $305_N$, and $308_N$. The transistors $306_N$ and $305_N$ are, in examples, p-type MOSFETs, and the transistors $304_N$ and $308_N$ are, in examples, n-type MOSFETs. Buffers $328_N$ and $330_N$ and pin $302_N$ couple as shown. Any number of legs with associated pins, transistors, and buffers may be present between the leg that includes transistor $306_2$ and the leg that includes transistor $306_N$. Transistors $304_N$ and $305_N$ correspond to the buffer 104 of FIG. 1.

In examples, the circuit 300 includes a leg that comprises transistors 332, 334, 336, and 338, coupled as shown. In examples, the transistors 332 and 336 are p-type MOSFETs, and in examples, the transistors 334 and 338 are n-type MOSFETs. In examples, a connection 340 couples a drain terminal of the transistor 334 to a gate terminal of the transistor 334. Similarly, in some examples, a connection 342 couples the gate and drain terminals of the transistor 336.

In examples, the circuit 300 further includes a leg that comprises resistors 318 and 320 with a node 322 positioned between the resistors 318 and 320. The node 322 is also positioned between the transistors 334 and 336 as shown. In some examples, the voltage of VDD 298 and the resistances of the resistors 318, 320 are selected to develop a predetermined voltage at the node 322.

In examples, the circuit 300 includes a leg that comprises transistors 310, 312, as shown with a resistor 311 positioned between the transistors 310, 312. In examples, the transistor 310 is a p-type MOSFET and the transistor 312 is an n-type MOSFET. In some examples, a connection 314 ties together the gate and drain terminals of the transistor 310, and in examples, a connection 316 couples the gate and drain terminals of the transistor 312. In some examples, the gate terminals of the transistors $306_1$, $306_2$, ..., $306_N$, 332, and 310 are coupled together. In some examples, the gate terminals of the transistors $304_1$, $304_2$, ..., $304_N$, and 334 couple together. In examples, the gate terminals of the transistors $305_1$, $305_2$, ..., $305_N$, and 336 couple together. In examples, the gate terminals of the transistors $308_1$, $308_2$, ..., $308_N$, 338, and 312 couple together. In some examples, the transistors $306_1$, $306_2$, ..., $306_N$ are sized larger (e.g., a 10:1 width-by-length sizing ratio) relative to the transistors 332, 310. Similarly, in examples, the transistors $308_1$, $308_2$, ..., $308_N$ are sized larger (e.g., by a 10:1 width-by-length sizing ratio) relative to the transistors 338, 312. Other sizing ratios are contemplated.

The circuit 300 is illustrative, and the scope of disclosure is not limited to the specific circuit components shown in FIG. 3, nor is the scope of disclosure limited to the specific configuration of circuit components shown in FIG. 3. For example, although the transistors in circuit 300 are depicted as being MOSFETs, in some examples, other types of transistors are substituted for some or all of the MOSFETs. In some examples, different transistor sizes are used. In some examples, resistors with different resistances are used. In some examples, one or more of the various components are connected within the circuit 300 differently than shown in FIG. 3. Many such variations of the circuit 300 are possible that operate according to the same or similar general principle as circuit 300. All such variations are contemplated and included within the scope of this disclosure.

The principle of operation in the circuit 300 is similar to that of the circuit 200 in FIG. 2. One difference in the operations of the circuits 300 and 200 is that in the circuit 300, the bias circuitry—the legs comprising the transistors 332, 334, 336, 338, resistors 318, 320, and transistors 310, 312—is shared among the N legs having N pins. Thus, for example, when any pin $302_1$, $302_2$, ..., $302_N$ is floating, the voltage developed at node 322 by the resistors 318, 320 is level-shifted by the transistors 334, 336 and by the transistors to which that floating pin couples, and it is then applied to the floating pin. Similarly, when a pin is floating, the current generated by the leg including transistors 310, 312 is mirrored to the leg corresponding to the floating pin, thereby causing the buffers corresponding to that leg to output a high voltage and a low voltage, as described above.

In the foregoing discussion and in the claims, the terms "including" and "comprising" are used in an open-ended fashion, and thus should be interpreted to mean "including, but not limited to ...." Also, the term "couple" or "couples" is intended to mean either an indirect or direct wired or wireless connection. Thus, if a first device couples to a second device, that connection may be through a direct connection or through an indirect connection via other devices and connections.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. An apparatus comprising:
   a pin;
   an input buffer coupled to the pin;
   a first current mirror coupled to the input buffer, the first current mirror comprising three transistors, each of the three transistors in the first current mirror coupling to a different one of three legs of the apparatus;
   a second current mirror coupled to the input buffer, the second current mirror comprising three transistors, each of the three transistors in the second current mirror coupling to a different one of the three legs of the apparatus;
   multiple level shifters positioned in a common leg of the three legs;
   a voltage divider circuit coupled to the multiple level shifters;
   a first output buffer coupled to the input buffer and the first current mirror; and
   a second output buffer coupled to the input buffer and the second current mirror.

2. The apparatus of claim 1, wherein the input buffer comprises a p-type metal oxide semiconductor field effect transistor (MOSFET) coupled to an n-type MOSFET.

3. The apparatus of claim 2, wherein the p-type MOSFET and the n-type MOSFET of the input buffer are positioned in a single leg of the three legs.

4. The apparatus of claim 1, wherein the multiple level shifters include first and second metal oxide semiconductor field effect transistors (MOSFETs), wherein the first MOSFET is an n-type MOSFET and the second MOSFET is a p-type MOSFET.

5. The apparatus of claim 4, wherein the voltage divider circuit comprises a pair of resistors, and wherein a node between the resistors comprises a node between the first and second MOSFETs of the multiple level shifters.

6. The apparatus of claim 1, wherein at least one of the three transistors in the first current mirror is sized differently than the remaining transistors in the first current mirror, and wherein at least one of the three transistors in the second current mirror is sized differently than the remaining transistors in the second current mirror.

7. The apparatus of claim 6, wherein transistors in the input buffer have width-by-length sizes that are smaller than width-by-length sizes of other transistors coupled to the transistors in the input buffer.

8. The apparatus of claim 1, wherein gates of transistors in the input buffer couple to gates of transistors in the multiple level shifters.

9. An apparatus comprising:
   a pin;
   a first n-type metal oxide semiconductor field effect transistor (MOSFET) coupled to the pin;
   a first p-type MOSFET coupled to the pin;
   a second p-type MOSFET coupled to the first n-type MOSFET;
   a second n-type MOSFET coupled to the first p-type MOSFET;
   a third p-type MOSFET coupled to the second p-type MOSFET;
   a third n-type MOSFET coupled to the third p-type MOSFET and to the first n-type MOSFET;
   a fourth p-type MOSFET coupled to the third n-type MOSFET and to the first p-type MOSFET;
   a fourth n-type MOSFET coupled to the fourth p-type MOSFET and to the second n-type MOSFET;
   a fifth p-type MOSFET coupled to the second and third p-type MOSFETs;
   a fifth n-type MOSFET coupled to the second and fourth n-type MOSFETs;
   a voltage divider circuit comprising two resistors, a node between the resistors comprising a node between the third n-type MOSFET and the fourth p-type MOSFET;
   a first output buffer coupled to the first n-type MOSFET and the second p-type MOSFET;
   a second output buffer coupled to the first p-type MOSFET and the second n-type MOSFET; and
   a voltage source coupled to the second, third, and fifth p-type MOSFETs, wherein the second, fourth, and fifth n-type MOSFETs couple to ground.

10. The apparatus of claim 9, wherein the first n-type and p-type MOSFETs are sized to carry less current than the second p-type MOSFET.

11. An apparatus, comprising:
a voltage source;
a current mirror coupled to the voltage source;
a voltage divider circuit coupled to the voltage source;
multiple level shifters coupled to the voltage divider circuit; and
two or more legs coupled to the current mirror and the multiple level shifters, each of the two or more legs comprising:
  a pin;
  a first n-type field effect transistor (FET) coupled to the pin;
  a first p-type FET coupled to the pin;
  a first output buffer coupled to the first n-type FET;
  a second output buffer coupled to the first p-type FET;
  a second p-type FET coupled to the first output buffer; and
  a second n-type FET coupled to the second output buffer.

12. The apparatus of claim 11, wherein the first n-type FET has a smaller width-by-length size than the second p-type FET.

\* \* \* \* \*